United States Patent

Peacock et al.

[11] Patent Number: 5,965,900
[45] Date of Patent: Oct. 12, 1999

[54] TUNNEL-EFFECT SUPERCONDUCTIVE DETECTOR CELL

[75] Inventors: Anthony Peacock, Noordwijkerhout, Netherlands; Robert Venn, Cambridge, United Kingdom

[73] Assignee: Agence Spatiale Europeenne, Paris, France

[21] Appl. No.: 09/205,599

[22] Filed: Dec. 4, 1998

[30] Foreign Application Priority Data

Dec. 5, 1997 [FR] France .................................. 97 15384

[51] Int. Cl.[6] .............................. H01L 29/06; H01L 39/22
[52] U.S. Cl. ............................ 257/34; 257/32; 257/35; 257/36
[58] Field of Search ................................ 257/30, 31, 32, 257/34, 35, 36

[56] References Cited

U.S. PATENT DOCUMENTS 4,470,190  9/1984  Fulton et al. .
5,109,164  4/1992  Matsui ........................... 307/306
5,753,935  5/1998  Kurakado et al. .................. 257/31

FOREIGN PATENT DOCUMENTS 375465   6/1990  European Pat. Off. .
2696544  4/1994  France .

Primary Examiner—Ngân V. Ngô
Attorney, Agent, or Firm—Alston & Bird LLP

[57] ABSTRACT

The invention relates to a detector cell comprising tunnel-effect superconductive devices organized in a two-dimensional array and placed on a common substrate, each superconductive device comprising a tunnel-effect superconductive junction and being electrically connected to a bottom connection area and to a top connection area. The superconductive devices are separated from one another by trenches extending down to and including the bottom connection area and defining individual bottom connection areas disposed between each of said junctions and the substrate. At least one individual bottom connection area is electrically connected to at least one bottom connection area of an adjacent superconductive device by a localized bridge region.

9 Claims, 2 Drawing Sheets

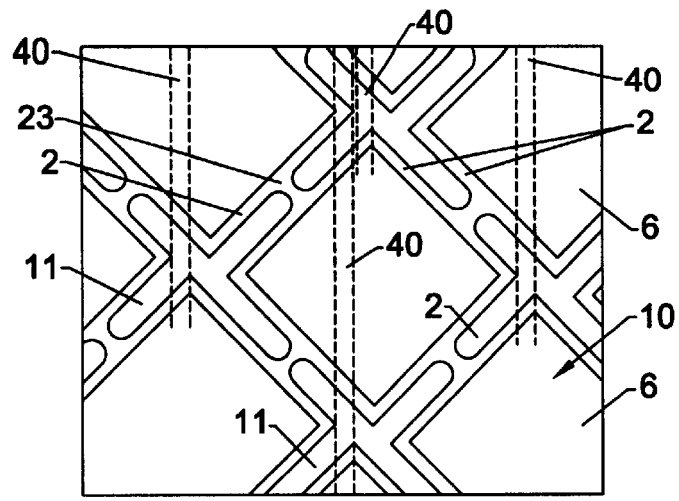
FIG. 3.
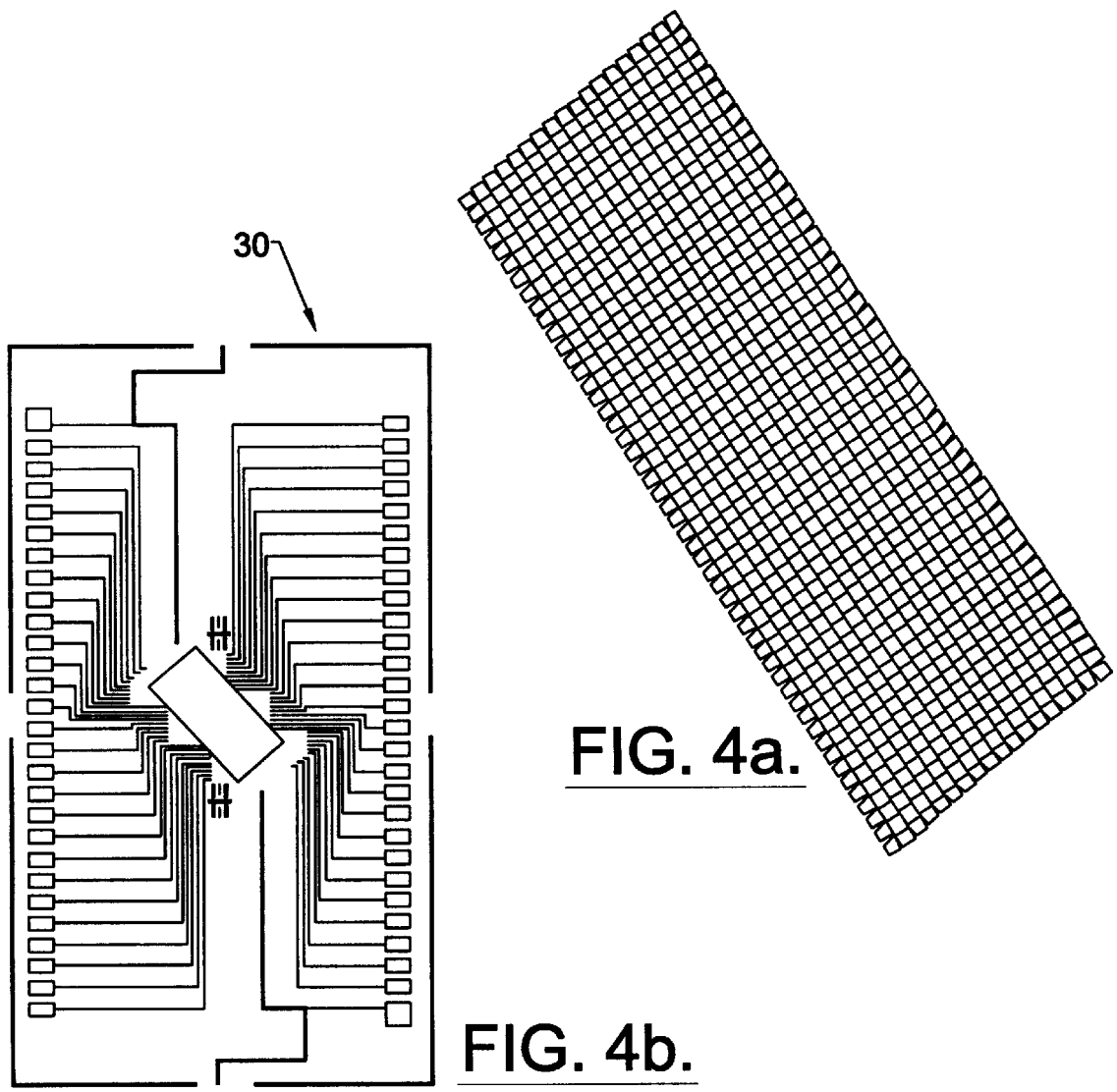
FIG. 4a.
FIG. 4b.

TUNNEL-EFFECT SUPERCONDUCTIVE DETECTOR CELL

The present invention relates to a detector cell comprising tunnel-effect superconductive devices organized in a two-dimensional array and deposited on a common substrate, each superconductive device comprising a tunnel-effect superconductive junction electrically connected to a bottom connection area and to a top connection area.

BACKGROUND OF THE INVENTION

Such a device is known from the article by E. Eposito et al. entitled "Development of a dark matter detector using series arrays of superconducting tunnel junctions", published in "Nuclear Instruments and Methods in Physics Research" A370 (1996) pp. 31–33.

Arrays of Josephson tunnel-effect devices are also known:

from the article by F. Muller et al. entitled "Performance of Josephson array systems related to fabrication techniques and design" published in IEEE Transactions on Applied Superconductivity, Vol. 5, No. 2 (June 1995); and from French patent FR 2 696 544 entitled "Cellule de detection, Detecteur, Capteur et Spectroscope" [A detector cell, a detector, a sensor, and a spectroscope] filed on Oct. 5, 1992 and granted on Jun. 23, 1995 to the Applicant.

OBJECTS AND SUMMARY OF THE INVENTION

The present invention seeks to provide a detector cell having array of Josephson junctions which presents high integration density and which makes it possible in particular to implement a superconductive picture-taking device, e.g. a superconductive motion-picture camera.

The idea on which the invention is based is to provide physical separation between the tunnel-effect devices while providing a bottom electrical connection that enables bottom contacts to be reduced to a contact that is common to a group of devices or even to a single contact for all of the devices.

The invention thus provides a detector cell comprising tunnel-effect superconductive devices organized in a two-dimensional array and deposited on a common substrate, each superconductive device comprising a tunnel-effect superconductive junction electrically connected to a bottom connection area and to a top connection area, wherein the superconductive devices are separated from one another by a trench region extending down to and including the bottom connection area so as to provide physical separation between adjacent semi-conductor devices and so as to define individual bottom connection areas disposed between respective junctions and the substrate, and wherein at least one individual bottom connection area is electrically connected to at least one bottom connection area of an adjacent superconductive device by a localized bridge region.

Preferably, at least one said bridge region comprises two appendices whose ends are electrically interconnected by a localized area. In particular, said connection is made by means of a material having a forbidden bandwidth $2\Delta$ greater than (or in the limit equal to) that of the material constituting said individual bottom conduction areas and the appendices.

At least one of said bridge regions may be of a width lying in the range 0.5 microns ($\mu$m) to 2 $\mu$m and preferably in the range 0.5 $\mu$m to 1 $\mu$m.

The width of at least one of said bridge regions may be less than or equal to the width of said trench region.

In a preferred embodiment, the bottom connection area of each superconductive device is connected by respective ones of said bridge regions to the bottom connection areas of each superconductive device adjacent thereto.

Advantageously, the superconductive devices are mesas of quadrilateral shape (preferably of square shape), and the superconductive devices situated in adjacent rows are offset from one another by a distance that is less than their pitch, and the top connection areas have conductive terminations disposed in line with the diagonals of said quadrilaterals. As a result, the conductive terminations can be electrically connected in line with the diagonals of the respective junctions (which is preferable from a magnetic point of view), better spacing of the terminations is obtained, and in addition there is no capacitive interaction between the various junctions and their terminations.

BRIEF DESCRIPTION OF THE DRAWINGS

Other characteristics and advantages of the invention appear more clearly on reading the following description given by way of non-limiting example and made with reference to the accompanying drawings, in which:

FIG. 3 is a plan view showing a detail of an array of cells constituting a preferred embodiment of the invention; and FIG. 4a is a plan view of a detector cell as shown in FIG. 3, while FIG. 4b shows how it is connected in order to form a device such a superconductive camera.

MORE DETAILED DESCRIPTION

Figure 1:
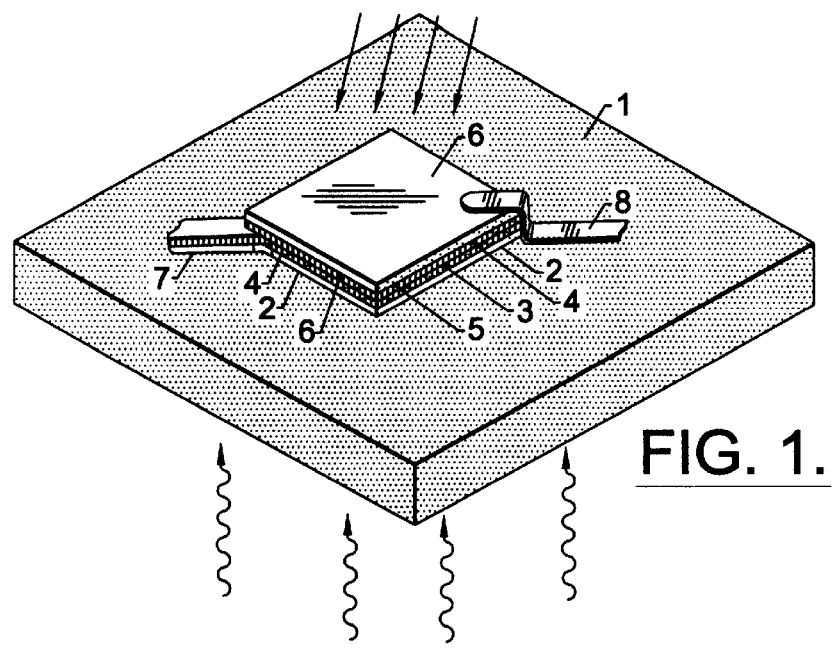
FIG. 1 shows a square mesa constituting a tunnel-effect superconductive device.

Firstly, it is briefly recalled that tunnel-effect superconductive detectors have two major advantages over conventional semiconductor detectors.

Firstly, by virtue of the theory of Bardeen, Cooper and Schrieffer (BCS), the energy gap or forbidden bandwidth $2\Delta$ between the non-excited state represented by Cooper pairs in an ordered state, and the first excited state containing broken Cooper pairs also known as "quasi-particles", is in general less than one-thousandth of the energy gap between the valence band and the conduction band of a semiconductor.

Secondly, the Debye energy $\Omega_D$ is much greater than the energy gap $2\Delta$, thereby enabling phonons generated by photoabsorption to break the Cooper pairs and create free charges. For solid aluminum, $2\Delta$ is about 170 $\mu$eV whereas $\Omega_D$ is of the order of 37 $\mu$eV.

In a superconductor, and at a given transition temperature, conduction electrons interact with the lattice by positive electron-phonon interaction, which overcomes their mutual Coulomb repulsion, thus forming pairs of electrons, and it is these Cooper pairs which transport the electrical current.

The phase change at which electrons begin to organize themselves in the form of Cooper pair condensates takes place at a temperature which is known as the critical temperature Tc. The Debye energy can be interpreted as being the maximum energy associated with the vibration modes of the lattice.

The absorption of a photon of wavelength $\lambda$ (mn) by a superconductor gives rise to a series of rapid processes during which the energy $\lambda$(eV) of the photon is converted into broken Cooper pairs (quasi-particles) and into phonons. For a commonly-used superconductor such as niobium, the conversion process occurs about 2 nano-seconds after a distribution unbalance comes into existence between the quasi-particles and the phonons. When the temperature is low enough, i.e. at about one-tenth of the critical temperature Tc(K), the initial number of quasi-particles $N_0$ created by the absorption of a photon of wavelength $\lambda$ can exceed the thermally-induced population, and it is inversely proportional to the wave-length $\lambda$. For most semiconductors:

$$N_0(\lambda) = 7 \times 10^5 / \lambda \Delta(T)$$

The mean energy required for creating a single quasi-particle in niobium and in tin is of the order of $1.75\Delta$ and $1.7\Delta$, respectively. The Fano resolution limit has the following value:

$$d\lambda_F(nm) = 2.8 \times 10^{-3} \lambda^{3/2} [F(\Delta T)]^{1/2}$$

in which formula the gap $\Delta$ is expressed in meV and $\lambda$ in nanometers (nm).

The values $\epsilon \approx 1.75\Delta$ and the Fano factor $F \approx 0.2$ apply to most elemental semiconductors. For niobium, the Fano factor F is about 0.22 and for tin it is about 0.19.

The above two equations are fundamental. They define the charge generated in a superconductor at a temperature T, having an energy gap $\Delta$ on photoabsorption of a photon of wavelength $\lambda$. For a superconductor such as tantalum at a temperature of Tc/10, where Tc=4.5 K, the initial charge $N_0(\lambda)$ generated by the photoabsorption of a photon of wavelength $\lambda$ equal to 500 nm is about 2000 quasi-particles. Under such circumstances, the corresponding Fano resolution limit of tantalum is about 12 nm.

These two equations can be generalized to any superconductive element, or to a particular compound, having a critical temperature Tc, by applying the BCS approximation to the low coupling limit which associates the bandwidth of a material at absolute zero to its value at the temperature Tc, for example $\Delta=1.75kTc$, where k is Boltzmann's constant. Thus:

$$N_0(\lambda) = 4.6 \times 10^6 / \lambda Tc$$

and $$d\lambda_F(nm) \approx 5 \times 10^{-4} \lambda^{3/2} Tc^{1/2}$$

For tantalum, resolution over the range from the ultraviolet Lyman alpha line at 120 nm to the near infrared can vary over the range from about 1.5 nm to about 30 nm, respectively, with $N_0(\lambda)$ varying over the range from about 8000 to about 1000 electrons.

For a superconductor having a low value of Tc, e.g. hafnium, the Fano resolution varies over the same pass-band between about 0.2 nm and about 15 nm. Naturally, the price to be paid for such resolution is the temperature at which the superconductive needs to be used which must be about 0.1Tc to 0.2Tc.

Unlike a semiconductive detector such as a charge coupled device (CCD), a superconductive detector cannot retain electric charge.

To detect the quasi-particles which are produced in excess during a photoabsorption process, it is appropriate to ensure that they make use of the tunnel effect to pass from a thin superconductive film S1 in which they are generated to another thin superconductive film S2 through a thin insulating layer I. The probability of obtaining the tunnel effect is optimal when the insulating barrier is very thin, being about 1 nm thick, i.e. only a few atom layers thick. Such an SIS structure constitutes a tunnel-effect superconductive junction, also known as a Josephson junction.

A low intensity magnetic field is applied parallel to the junction-forming barrier (see FIG. 1) so as to cancel the Josephson current which comes from the tunnel-effect transition of Cooper pairs at zero bias voltage. The application of a bias voltage Vb that is less than $2\Delta/e$, where e is the charge of an electron, makes it possible to ensure that only transitions due to the tunnel effect come from the transfer of quasi-particles from one film to the other. The flow of quasi-particles during a time t produces a measurable electric current which can be detected above the underlying level of current fluctuations by means of an electric charge amplifier. The underlying current comes either from a residual thermal population of quasi-particles generating thermal noise current, or else from leakage currents. The current pulses are generally of amplitude that is proportional to the energy of the incident photon, and the rise time of a pulse can be used to validate an event.

The two-dimensional array of a detector cell of the invention comprises individual superconductive devices 10 disposed on a substrate 1, e.g. of sapphire or of $MgF_2$, with each device comprising the following (cf. FIG. 1.):

an individual bottom connection area 2 of square shape constituted by a film of tantalum ($\Delta=0.7$ meV) grown epitaxially on the sapphire substrate 1;

a square superconductive junction comprising a tunnel layer 4 of $AlO_x$ that is of square shape and about 1 nm thick disposed between two square layers 3 and 5 of aluminum ($\Delta=0.17$ meV); and a top individual connection area 6 of tantalum ($\Delta=0.7$ meV) that is likewise square in shape.

By way of illustration, FIG. 1 shows a single superconductive device whose bottom connection is provided by a bottom termination 7 which extends the area 2 and the layer 3 along a diagonal of the device, and a termination 8 in contact with area 6.

In the array of the invention, respective bottom connections are not implemented for each of the individual devices 10.

Figure 2A:
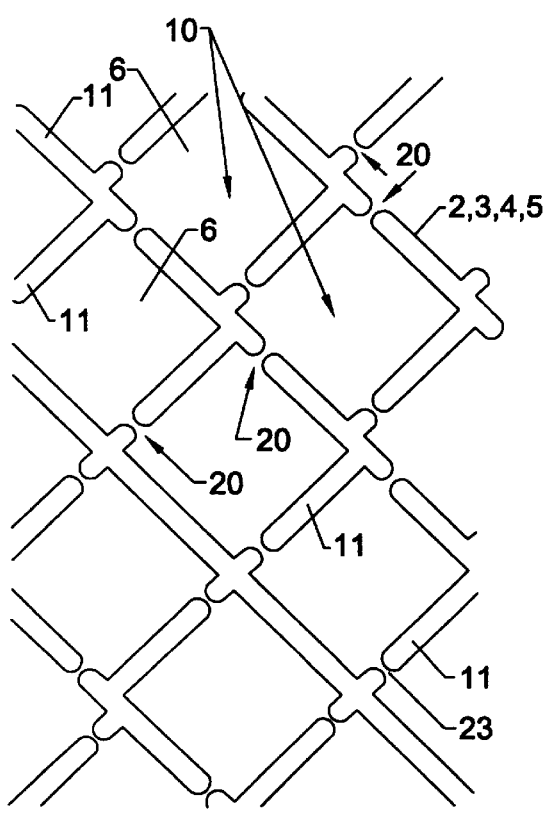
FIG. 2a is a plan view of a portion of a region of the cell of the invention.
Figure 2B:
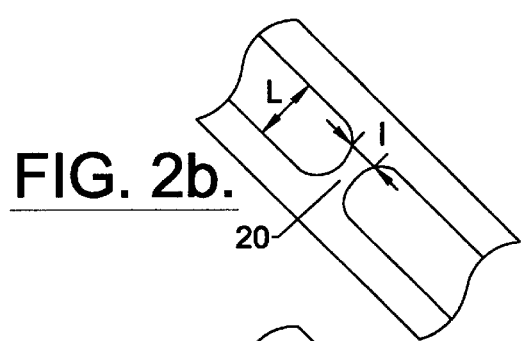
FIG. 2b to 2d are details of FIG. 2a before and after bridging by means of bridge regions having localized areas.
Figure 2C:
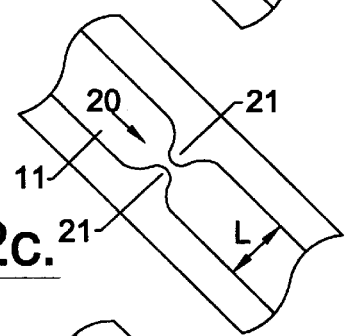
Figure 2D:
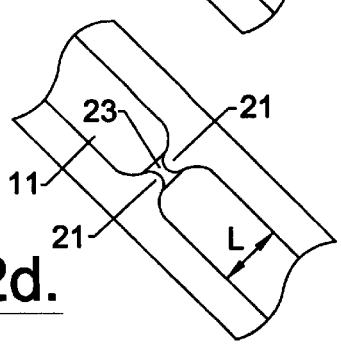

As shown in FIGS. 2a, 2c, and 2d, the unit devices 10 of the array are each square in shape and they are separated by trenches 11. The trenches 11 extend from the areas 6 down to and including the individual bottom connection areas 2.

According to the invention, these trenches 11 serve to separate the individual devices 10 physically from one another, and the individual areas 2 are electrically interconnected by bridge regions 20. The trenches 11 thus extend down to the substrate 1 with the exception of the bridge regions 20. In particular, as shown in FIGS. 2c and 2d, these bridge regions 20 are interrupted and each presents a pair of facing appendices 21 belonging to two adjacent individual areas 2, the appendices being united by a localized area 23 made of a material having forbidden bandwidth $2\Delta$ that is greater than (or in the limit equal to) the forbidden bandwidth of the material constituting the bottom connection areas 2. For example, when the areas 2 and the appendices 21 are made of tantalum, the localized areas 23 can be made of niobium ($\Delta=1.525$ meV).

By making the localized areas 23 out of a material having a forbidden bandwidth greater than that of the material constituting the bottom connection areas, the areas 23 can act as mirrors which reflect charge to the individual devices constituting the image points or pixels of the array, thereby making it possible to avoid losses between the various pixels.

By way of example, the size of the individual devices can be about 50 μm by 50 μm (or less), which size makes it possible to minimize thermal current at temperatures of about 0.3 K to 0.4 K, and also to reduce capacitive noise.

The top contacts are preferably placed on the corners of the individual devices to satisfy criteria relating to the magnetic fields.

The dimensions of the interconnections are limited by present photolithographic technology to sizes of about 1.5 μm to 2 μm. The method implemented limits the width of the top contact terminations and the number of devices per row on a substrate of given size, which means that the minimum size of individual devices with present photolithographic techniques is about 20 μm×20 μm, and that the width of the strips of metallization can be about 1 μm.

An effect of the individual areas 2 of the individual devices being electrically interconnected is that the film forming the bottom contact is common, electrically speaking, to all of the individual devices (or to a group of individual devices) thus making it possible to reduce thermal bridges, since only one link needs to be taken out of a cryostat, or perhaps two links, and in any event only a limited number of bottom contact links, instead of one bottom contact link for each individual device.

The presence of the trenches 11 and the bridge regions 20 makes it possible simultaneously to obtain physical separation between the individual superconductive devices and interconnection of the individual conductive areas 2. With present photolithographic techniques, it is possible to make bridge regions 20 of width that is as small as 0.5 μm to 1 μm. In practice, the bridge regions 20 and in particular the bridges 23 can be of width l lying in the range 0.5 μm to 2 μm, and preferably in the range 1 μm to 1.5 μm.

The width L of the trenches 11 is selected to be as narrow as possible given the photolithographic method. With present techniques, the recommended width is 2 μm.

FIGS. 3 and 4a show a detector cell having 18×50 individual devices organized in two adjacent subarrays each of 9×50 individual devices, thus giving rise to two bottom connection terminations. Each of the devices is in the form of a 50 μm×50 μm square, and the width L of the trench regions 11 is 4 μm, thus giving a pitch P of 54 μm.

In the longitudinal direction of the substrate, adjacent rows are offset by 6 μm, which means that rows that are spaced apart modulo 10 times the pitch P are in alignment. The presence of this offset, which is preferably equal to P/n, where n is an integer, makes it possible to place the top connection terminations in line with the diagonals of the Josephson junctions constituting the individual devices. The offset must be large enough to make it possible to leave sufficient space between the terminals for the fabrication method used. Under such conditions, a termination 40 of any one device is an alignment with the diagonal of said device without being in alignment with the diagonal of another device (FIG. 3).

To interconnect the individual devices of FIG. 4a, two series of 225 terminations are placed on either side, each comprising 113 outer terminations and 112 inner terminations, giving a total of 900 top terminations at a pitch of 60 μm (54+6) between terminations. To simplify the drawing, FIG. 4b shows the case of connecting an array of 6×9 individual devices comprising two subarrays of 3×9 devices, giving 54 top terminations, and two bottom contacts, implemented using the same principle.

In a method of manufacturing a detector cell of the invention, the bottom connection areas 2 and the top connection areas 6 are made of tantalum, which has a forbidden bandwidth 2Δ that is greater than that of the aluminum which is used to make the layers 3 and 5 between which the insulating layer of aluminum oxide is disposed. The cell is made on a sapphire substrate using a conventional 1 μm class photolithographic method, e.g. as described in the above-mentioned articles by E. Esposito or by F. Muller. The areas 2 are made first, together with the bridge regions 20 (FIG. 2b), by using a first mask. Thereafter the square areas 3, 4, 5, and 6 are made, and then a layer of $SiO_2$ all by using a second mask. As shown in FIG. 3, the areas 2 are slightly larger in both dimensions (by about 1 μm) than the areas 3, 4, and 5 so as to facilitate subsequent fabrication of the localized areas 23.

The uninterrupted bridge regions 20 of tantalum (FIG. 2b) are then cut to obtain the appendices 21 (FIG. 2c). This cutting can be performed by photolithography.

The localized areas 23 of niobium, having a forbidden bandwidth 2Δ greater than that of tantalum, are then deposited by photolithography (FIG. 2d).

Thereafter, openings of about 1 μm×1 μm are made by chemical etching through the layer of $SiO_2$. Each opening is square and extends to the corresponding area 6 which is not etched. Thereafter, polycrystalline niobium is deposited by sputtering through a mask to form strips having a width of 1 μm, for example, over the top of the $SiO_2$ layer, with each strip coming into contact with the top face of the corresponding area 6 in conventional manner. This makes it possible to make all of the electrical connections of the array out of a material whose forbidden bandwidth 2Δ is smaller than that of the material constituting the individual conductive areas 6.

Gold-plated areas are then deposited on the edge of the substrate 1 to enable connection wires to be connected to the terminations on a carrier 30.

We claim:

1. A detector cell comprising tunnel-effect superconductive devices organized in a two-dimensional array and deposited on a common substrate, each superconductive device comprising a tunnel-effect superconductive junction electrically connected to a bottom connection area and to a top connection area, wherein the superconductive devices are separated from one another by a trench region extending down to and including the bottom connection area so as to provide physical separation between adjacent semiconductor devices and so as to define individual bottom connection areas disposed between respective junctions and the substrate, and wherein at least one individual bottom connection area is electrically connected to at least one bottom connection area of an adjacent superconductive device by a localized bridge region.

2. A cell according to claim 1, wherein at least one said bridge region comprises two appendices whose ends are electrically interconnected by localized are.

3. A cell according to claim 2, wherein said localized bridge is made of a material having a forbidden bandwidth greater than or equal to that of the material constituting said bottom connection areas and said appendices.

4. A cell according to claim 1, wherein at least one of said bridge regions is of a width lying in the range 0.5 μm to 2 μm and preferably in the range 0.5 μm to 1 μm.

5. A cell according to claim 1, wherein the width of at least one of said bridge regions is less than or equal to the width of said trench region.

6. A cell according to claim 1, wherein the bottom connection area of each superconductive device is connected by respective ones of said bridge regions to the bottom connection areas of each superconductive device adjacent thereto.

7. A cell according to claim 1, wherein the superconductive devices are mesas of quadrilateral shape, and wherein the superconductive devices situated in adjacent rows are offset from one another by a distance that is less than their pitch, and wherein the top connection areas have conductive terminations disposed in line with the diagonals of said quadrilaterals.

8. A cell according to claim 1, wherein the superconductive devices form mesas that are square in shape.

9. A picture-taking device including a detector cell according to claim 1.

* * * * *

UNITED STATES PATENT AND TRADEMARK OFFICE
CERTIFICATE OF CORRECTION

PATENT NO. : 5,965,900

DATED : October 12, 1999

INVENTOR(S) : Peacock et al.

It is certified that error appears in the above-identified patent and that said Letters Patent is hereby corrected as shown below:

Column 6, line 52, after "by" insert --a--; "are" should read --area--.

Signed and Sealed this

Twenty-fifth Day of April, 2000

Attest:

Q. TODD DICKINSON

*Attesting Officer*　　　　　*Director of Patents and Trademarks*